(12) United States Patent
Liu et al.

(10) Patent No.: US 7,807,979 B2
(45) Date of Patent: Oct. 5, 2010

(54) SPECIMEN KIT AND FABRICATING METHOD THEREOF

(75) Inventors: Kuo-Liang Liu, Taipei County (TW); Tri-Rung Yew, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 352 days.

(21) Appl. No.: 11/952,148

(22) Filed: Dec. 7, 2007

(65) Prior Publication Data

US 2008/0135778 A1 Jun. 12, 2008

(30) Foreign Application Priority Data

Dec. 7, 2006 (TW) .............................. 95145623 A

(51) Int. Cl.
*G01F 23/00* (2006.01)

(52) U.S. Cl. .................. 250/440.11; 250/306; 250/307; 250/310; 250/442.11

(58) Field of Classification Search .................. 250/306, 250/307, 310, 311, 440.11, 442.11
See application file for complete search history.

(56) References Cited

U.S. PATENT DOCUMENTS 5,406,087 A 4/1995 Fujiyoshi et al.

7,253,418 B2 8/2007 Moses et al.

OTHER PUBLICATIONS

Article titled "Quantifying Electrochemical Nucleation and Growth of Nanoscale Clusters Using Real-Time Kinetic Data" authored by Radisic et al., Nano Letters 2006 vol. 6, No. 2 (pp. 238-242).

(Continued)

*Primary Examiner*—Jack I Berman
*Assistant Examiner*—Hanway Chang
(74) *Attorney, Agent, or Firm*—Jianq Chyun IP Office

(57) ABSTRACT

A specimen kit for enclosing a specimen is described, including a first substrate, a second substrate and a sealant. The first substrate has a first observation window at which a thickness thereof is smaller than that of the other parts thereof. The second substrate has a second observation window at which a thickness thereof is smaller than that of the other parts thereof, and is disposed on the first substrate such that the second observation window is aligned to the first observation window and an interval is present between the first and the second substrates. The sealant is disposed between the first and the second substrates and surrounds the first and the second observation windows to seal a space between fringes of the first and the second substrate, thus defining a specimen cell between the first and the second substrates.

25 Claims, 23 Drawing Sheets

OTHER PUBLICATIONS

Article titled "Study by Monte-Carlo simulation of resolution improvement by energy filtering in Bio-TEM" authored by Suga et al., Surface and Interface Analysis 2002; 34: (pp. 657-659).

Article titled "Scanning electron microscopy of cells and tissues under fully hydrated conditions" authored by Thiberge et al., PNAS vol. 101 No. 10; Mar. 9, 2004 (pp. 3346-3351).

Article titled "Dynamic microscopy of nanoscale cluster growth at the solid-liquid interface" authored by Williamson et al., Nature materials vol. 2 Aug. 2003, (pp. 532-536).

Article titled "Block Copolymer Lithography: Periodic Arrays of ~10 11 Holes in 1 Square Centimeter" authored by Park et al., Science 276, 1997 (pp. 1401 1404).

Article titled "The morphology and nucleation kinetics of copper islands during electrodeposition" authored by Radisic et al., Surface Science 600; 2006 (pp. 1817-1826).

SPECIMEN KIT AND FABRICATING METHOD THEREOF

CROSS-REFERENCE TO RELATED APPLICATION

This application claims the priority benefit of Taiwan application serial no. 95145623, filed on Dec. 7, 2006. The entirety of the above-mentioned patent application is hereby incorporated by reference herein and made a part of this specification.

BACKGROUND OF THE INVENTION

1. Field of the Invention

This invention relates to a specimen kit and a fabricating method thereof, and in particular, to a specimen kit applied to microscopes that is suitable for various types of specimens, especially liquid, magnetic and volatile specimens, and a fabricating method thereof.

2. Description of Related Art

Generally, specimens are observed in vacuo by electron microscopes as the molecules would scatter electrons. Since specimens have to be placed in a high vacuum and also have to be dehydrated, specimens containing liquids or volatile substances cannot be observed by utilizing electron microscopes.

Fujiyoshi et al. (U.S. Pat. No. 5,406,087) disclosed a specimen-holding device comprising polyvinyl ester films which transmit an electron beam and hold a specimen containing a liquid. The specimen-holding device also comprises O-rings pressed against the polymer films to isolate from the vacuum environment of the microscope. However, the polymer films of the device are easily damaged by long-term electron beam irradiation, and there is a need to modify general transmission electron microscopes (TEM) and specimen holders thereof so as to fit the device.

Suga et al. (Study by Monte-Carlo simulation of resolution improvement by energy filtering in Bio-TEM. *Surf Interface Anal.* 34, 657-659 (2002)) disclosed an instrument wherein a biological specimen is set in a conventional TEM but isolated from the high vacuum by a beryllium (Be) foil of 100 nm in thickness. However, general electron microscopes as well as the retainers and specimen holders thereof also have to be modified to fit the device.

A specimen holder for scanning electron microscopes (SEM) disclosed by Thuiberge et al. (Scanning electron microscopy of cells and tissues under fully hydrated conditions. *Proc. Nat. Acad. Sci. U.S.A.* 101(10), 3346-3351 (2004)) comprises a polyimide membrane. The polyimide membrane can endure long-term electron beam irradiation for its high melting point and outstanding stability; nevertheless, it cannot be applied to TEM.

As mentioned above, a specimen has to be dehydrated and placed in vacuum in traditional electron microscope. Although previous attempts have been made to address the inconvenience, such efforts have not been sufficient to adequately fulfill the increasing requirements for a continuous and real-time observation of a liquid specimen or a volatile specimen.

SUMMARY OF THE INVENTION

Accordingly, this invention is directed to a specimen kit applied to microscopes that is suitable for various types of specimens, especially liquid, magnetic and volatile specimens.

This invention is also directed to a method for fabricating a specimen kit of this invention.

The specimen kit of this invention is for enclosing a specimen to be observed by a microscope, including a first substrate, a second substrate and a sealant. The first substrate has therein a first observation window at which the thickness thereof is smaller than that of the other parts thereof. The second substrate has therein a second observation window at which the thickness thereof is smaller than that of the other parts thereof. The second substrate is disposed on the first substrate such that the second observation window is aligned to the first observation window and an interval is present between the first and the second substrates. The sealant is disposed between the first and the second substrates and surrounds the first and the second observation windows to seal a space between fringes of the first and the second substrate, thus defining a specimen cell between the first and the second substrates.

According to an embodiment, the microscope is an electron microscope, and the first and the second substrates respectively at the first and the second observation windows can be penetrated by an electron beam utilized in the electron microscope.

According to an embodiment, the specimen kit further comprises at least one micro-channel on a surface of at least one substrate within the specimen cell.

According to an embodiment, the specimen kit further comprises spacers disposed between the first and the second substrates. The spacers may be mixed with the sealant or disposed independently.

According to an embodiment, at least one substrate comprises a support material and a film on a side of the support material. The observation window may comprise only a portion of the film. The support material may comprise semiconductor or metal oxide.

The method for fabricating a specimen kit for enclosing a specimen to be observed by a microscope of this invention is described as follows. Two substrates are provided. An observation window is formed in each substrate, wherein the thickness of the substrate at the observation window is smaller than that of the other parts of the substrate. The two substrates are then assembled with a sealant such that an interval is present between the two substrates and the observation windows of the two substrates are aligned with each other to define a specimen cell between the substrates.

According to an embodiment, the microscope is an electron microscope, and the substrates at the observation windows can be penetrated through by an electron beam utilized in the electron microscope.

According to an embodiment, the method further comprises forming at least one micro-channel on a surface of at least one substrate before the two substrates are assembled, wherein the micro-channel is located within the specimen cell after the specimen cell is defined.

According to an embodiment, assembling the two substrates comprises applying the sealant to a surface of at least one of the two substrates, aligning the observation windows of the two substrates with each other and binding the substrates together with the sealant between the two substrates.

According to an embodiment, the method further comprises applying spacers between the two substrates to assist defining the interval.

According to an embodiment, the spacers are mixed with the sealant, or are applied before or after the sealant is applied.

According to an embodiment, each of the two substrates is formed by providing a support material and depositing a film on a surface of the support material. In such a case, forming the observation window may comprise depositing a mask layer on a side of the substrate opposite to the film, patterning the mask layer to form therein an opening corresponding to the observation window to be formed, removing a portion of the support material with the mask layer as a mask to expose a part of the film and removing the mask layer. The support material may comprise semiconductor or metal oxide.

As mentioned above, the specimen kit of this invention includes two substrates each having an observation window that can be penetrated by an electron beam, and the space between the substrates is hermetically sealed by a sealant to define a specimen cell for containing a specimen therein. Hence, the specimen kit can enclose a liquid specimen or a volatile specimen to isolate the same from a high vacuum environment. On the other hand, the fabricating method of a specimen kit of this invention allows a specimen kit to be fabricated by a current semiconductor process, so that the production cost is reduced.

Therefore, the present invention addresses and solves the problems attendant upon the conventional methods for observing a liquid, magnetic and volatile specimen with an electron microscope.

In order to make the aforementioned and other objects, features and advantages of the present invention comprehensible, a preferred embodiment accompanied with figures is described in detail below.

BRIEF DESCRIPTION OF THE DRAWINGS

FIGS. 1D and 1D-1 are schematic cross-sectional views of the specimen kit with micro-channels in FIG. 1A along Line I-I according to two examples of a second embodiment of this invention that are different in the manner of disposing the spacers.

DESCRIPTION OF THE EMBODIMENTS

Figure 1A:
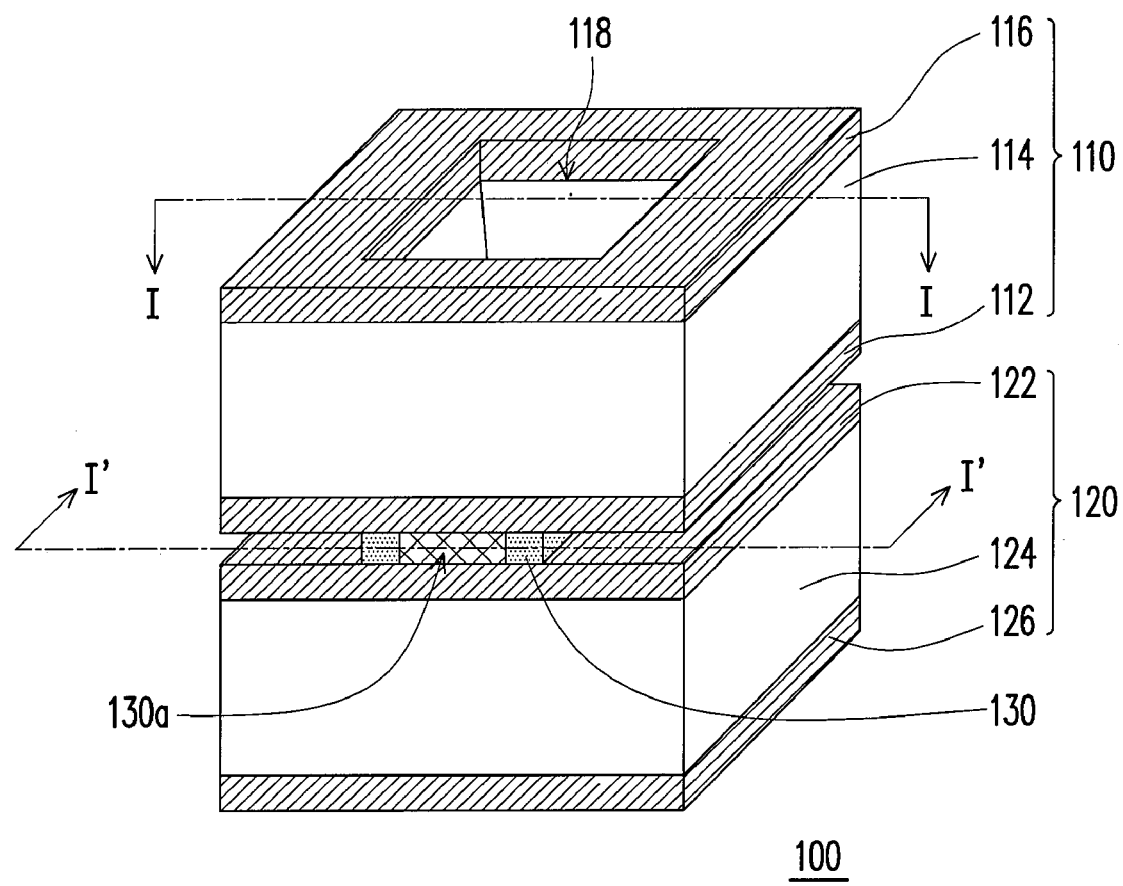
FIG. 1A is a schematic perspective view of a specimen kit according to a first embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
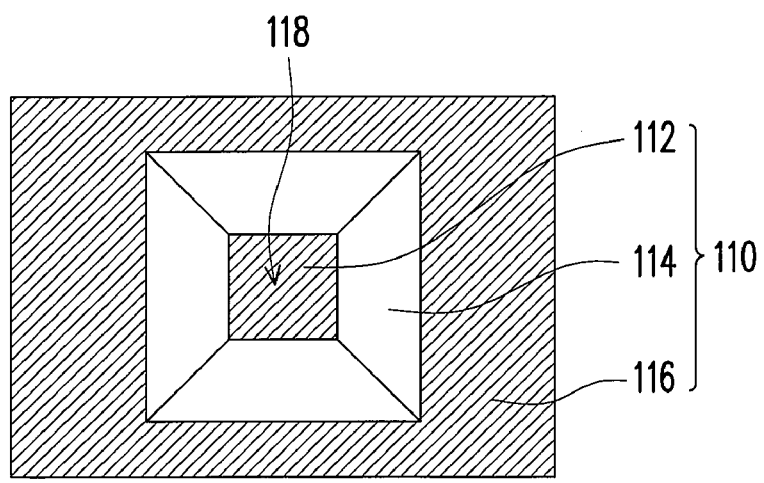
FIG. 1B is a schematic top view of the specimen kit in FIG. 1A.
Figure 1C:
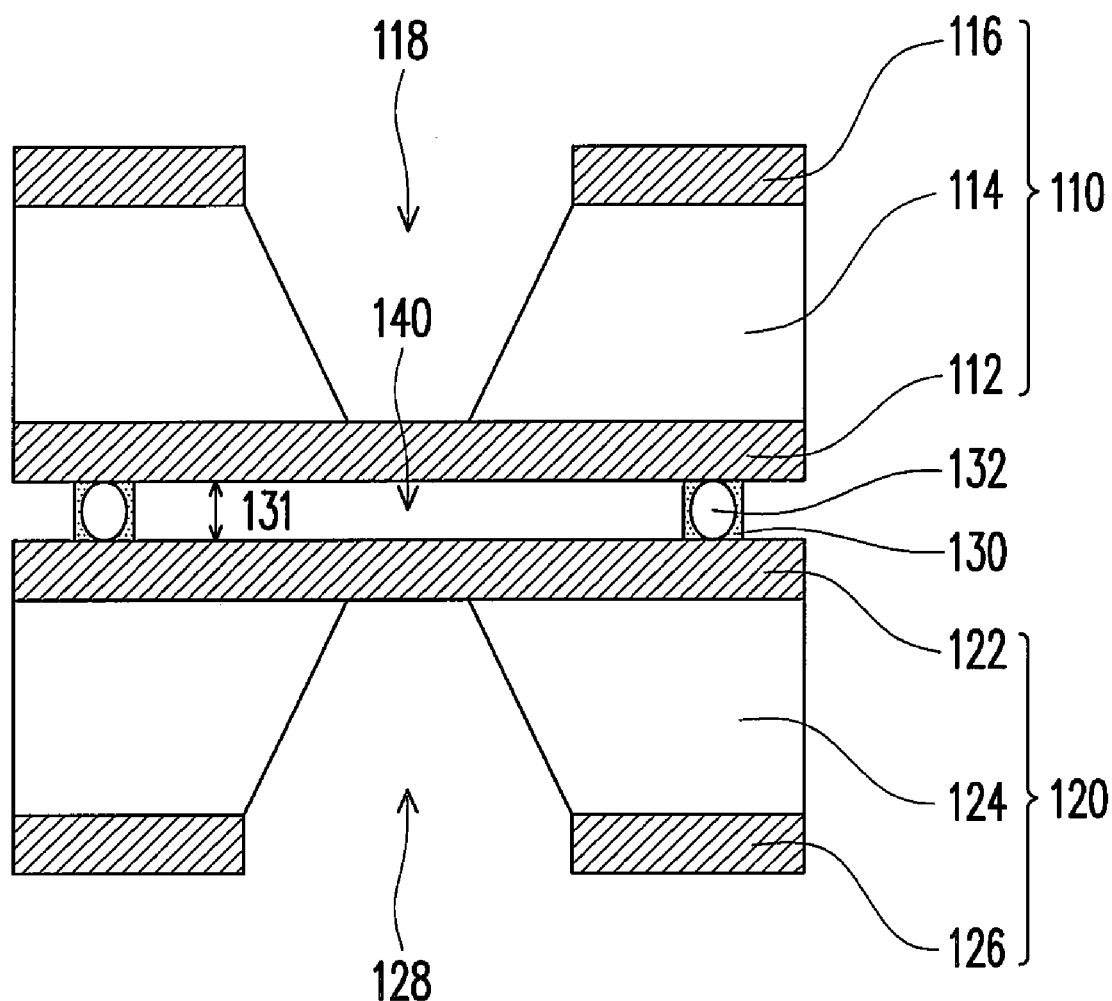
FIGS. 1C and 1C-1 are schematic cross-sectional views of the specimen kit without micro-channels in FIG. 1A along Line I-I according to two examples of the first embodiment of this invention that are different in the manner of disposing the spacers.

Reference is made to FIGS. 1A, 1B and 1C, which are simplified perspective, top and cross-sectional views of a specimen kit 100 according to the first embodiment of this invention. The specimen kit 100 includes two substrates 110 and 120 and a sealant 130. The substrate 110 and 120 are disposed opposite to each other with an interval 131 between them. The interval 131 is within the range of 10 nm to 20 μm, preferably 0.1 μm to 10 μm. The sealant 130 is disposed between the substrates 110 and 120 for sealing the space between the fringes of the substrates 110 and 120.

The substrate 110 includes a support material 114 with two films 112 and 116 formed on both sides thereof. The substrate 120 includes a support material 124 with two films 122 and 126 formed on both sides thereof. The support material 114 or 124 is, for example, a semiconductor layer having been processed by single- or double-surface polishing, or a metal oxide layer, wherein the semiconductor might be silicon, silicon oxide, silicon nitride, silicon carbide or its derivative, and the metal oxide might be aluminium oxide. The films 112, 116, 122 and 126 include a material having high strength and transparent to an electron beam, e.g., silicon oxide, silicon nitride, silicon carbide or a derivative thereof. Each of the films 112, 116, 122 and 126 has a thickness within the range of 2 nm to 100 nm, preferably 5 nm to 20 nm.

Additionally, each of the substrates 110 and 120 has an observation window formed therein. An electron beam can travel through the specimen kit 100 by way of penetrating the observation windows. The observation window 118 or 128 is disposed at one side of the substrate 110 or 120. The thickness of the substrate 110 or 120 at the observation windows 118 or 128 is smaller than that of the other parts thereof. In an embodiment, the observation window 118 or 128 is presented in a form of an opening formed in the support material 114 or 124 and in the film 116 or 126 to expose a portion of the film 112 or 122. The area of the observation window 118 or 128 is within the range of 1 $\mu m^2$ to 1 $mm^2$, preferably 100 $\mu m^2$ to 10000 $\mu m^2$.

Referring to FIGS. 1A-1C again, the sealant 130 is applied between the substrates 110 and 120 to hermetically seal the space between the fringes thereof. Specifically, the sealant 130 is applied between the films 112 and 122. The observation windows 118 and 128 are surrounded by the sealant 130 to enclose a specimen cell 140. The sealant 130 may be an ultraviolet (UV) curable adhesive, silicone, thermosetting resin like epoxy resin, or other adhesive material binding excellently to the films 112 and 122. With reference to FIG. 1A, a portion 130a of the sealant 130 is not formed with the other portions simultaneously, but is formed after the specimen is injected into the specimen cell 140 defined by the other portions of the sealant 130.

Figures 1, 1C:
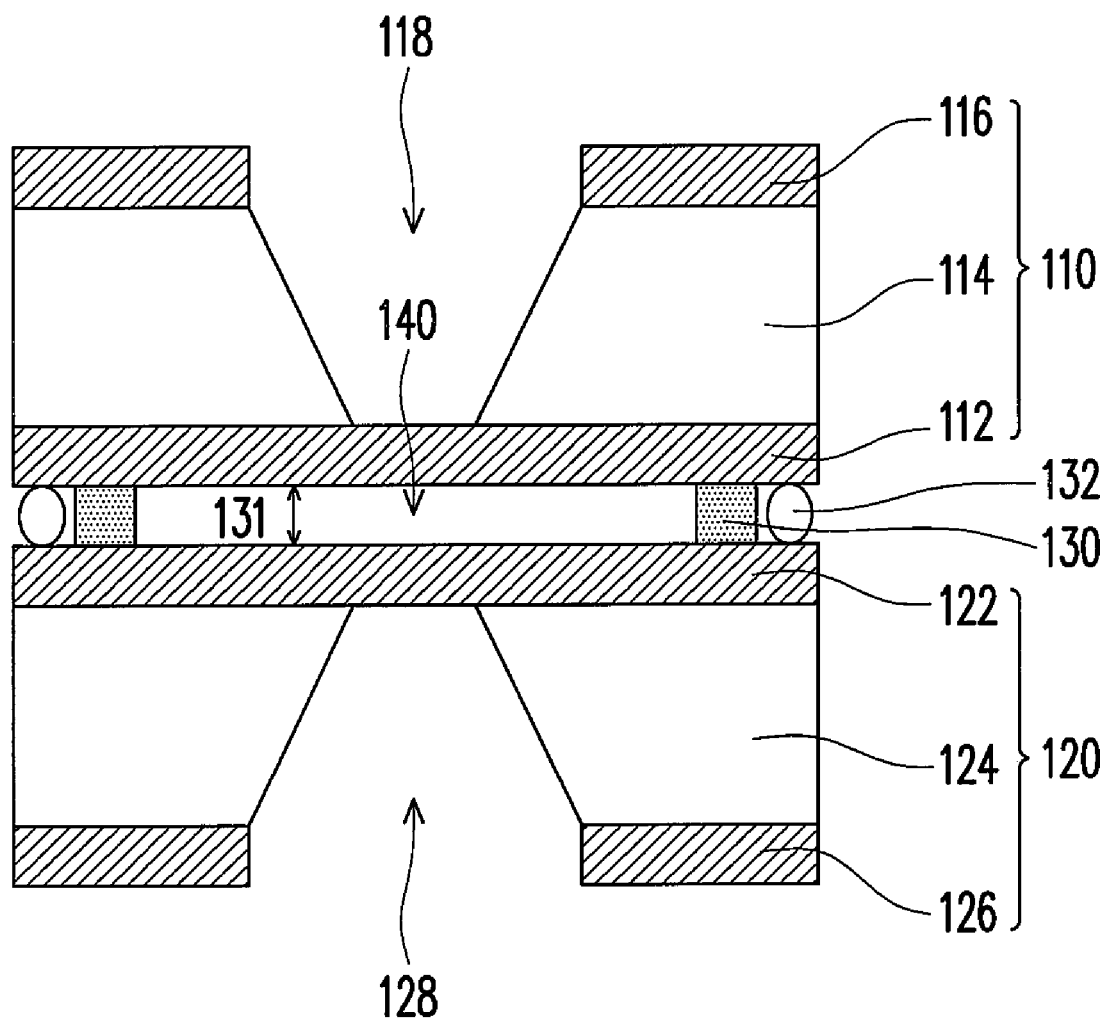

It should be noted that spacers 132 are disposed between the films 112 and 122 to assist defining the interval 131. In an example, as shown in FIG. 1C, the spacers 132 are mixed with the sealant 130. In another example, as shown in FIG. 1C-1, the spacers 132 are applied to a region other than where the sealant 130 is disposed. The material for the spacers 132 may be silicon ball, glass fiber, photoresist, metal, silicon oxide, silicon nitride, silicon carbide or a derivative thereof. The size of the spacers 132 may be within the range of 10 nm to 20 μm, preferably 0.1 μm to 10 μm, determined according to the properties and size of the specimen to be observed.

Figure 1D:
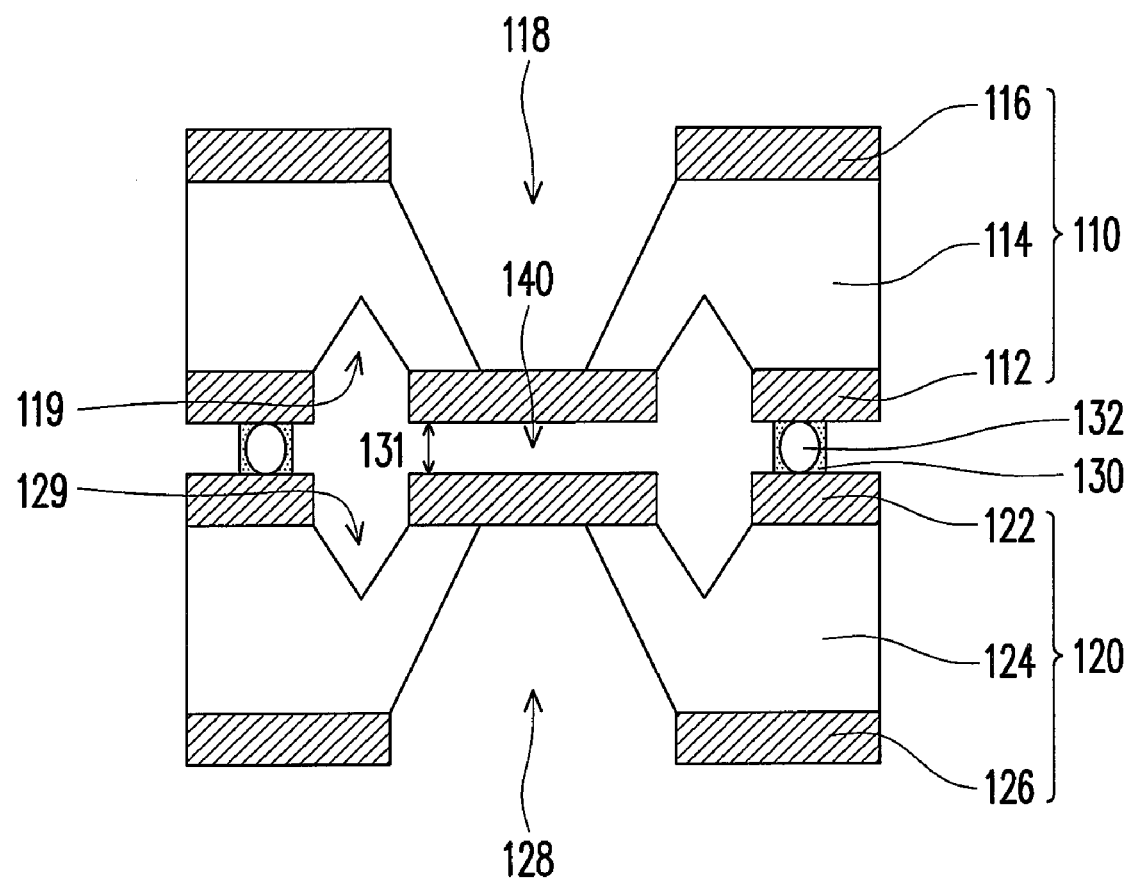
Figures 1, 1D:
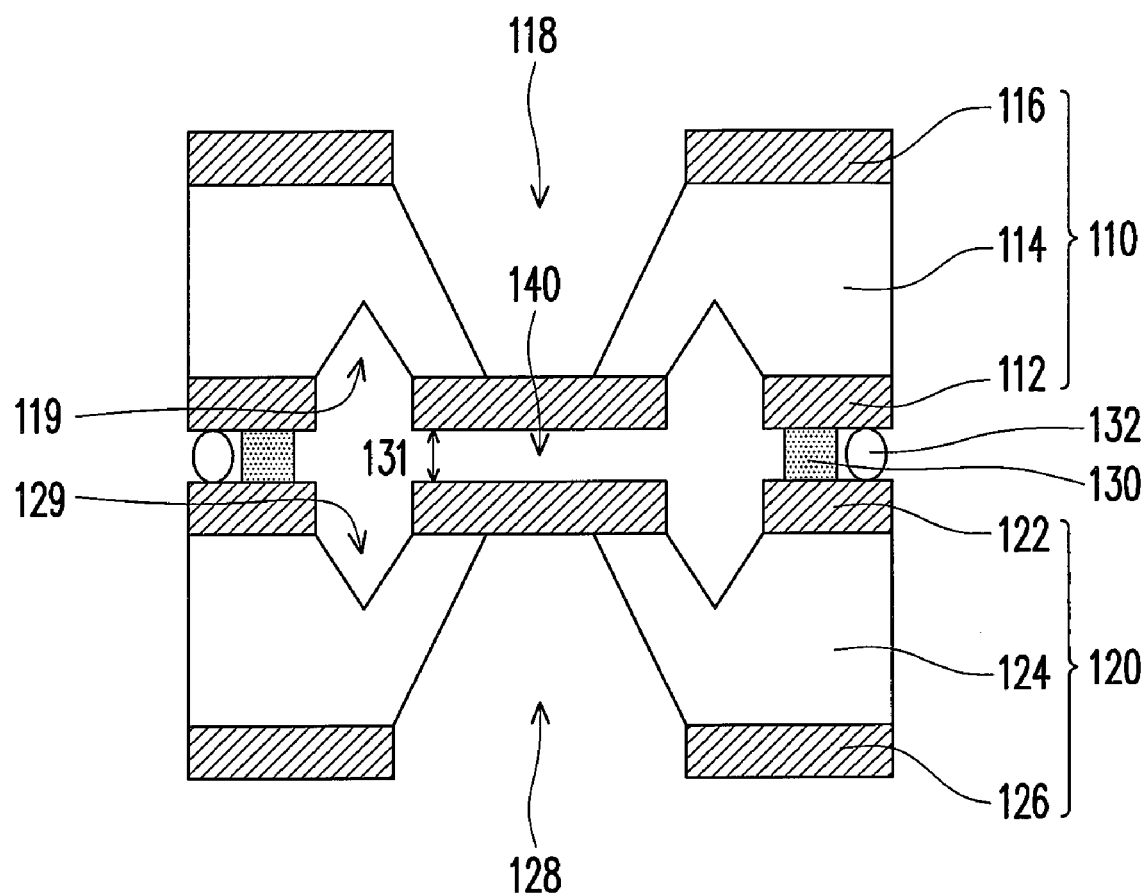
Figure 1E:
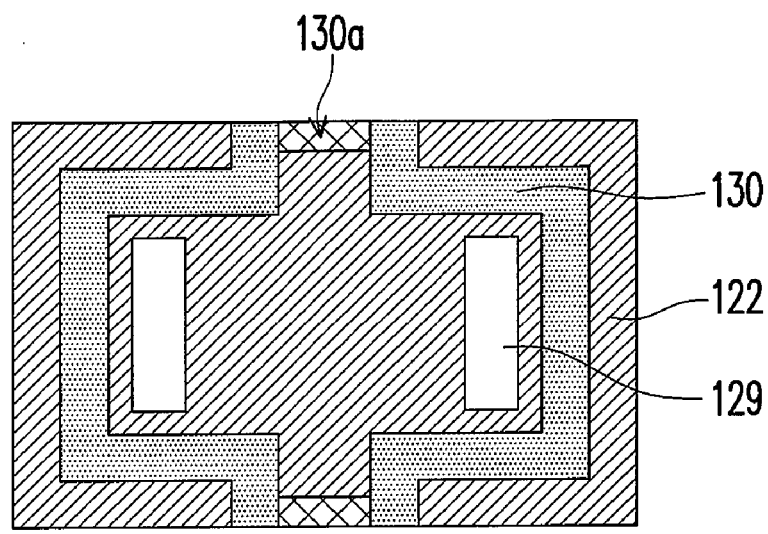
FIGS. 1E-1K are schematic cross-sectional views of the specimen kit with micro-channels in FIG. 1A along Line I'-I' according to seven examples of the second embodiment of this invention that are different in the form(s) of the sealant and/or the micro-channel.
Figure 1F:
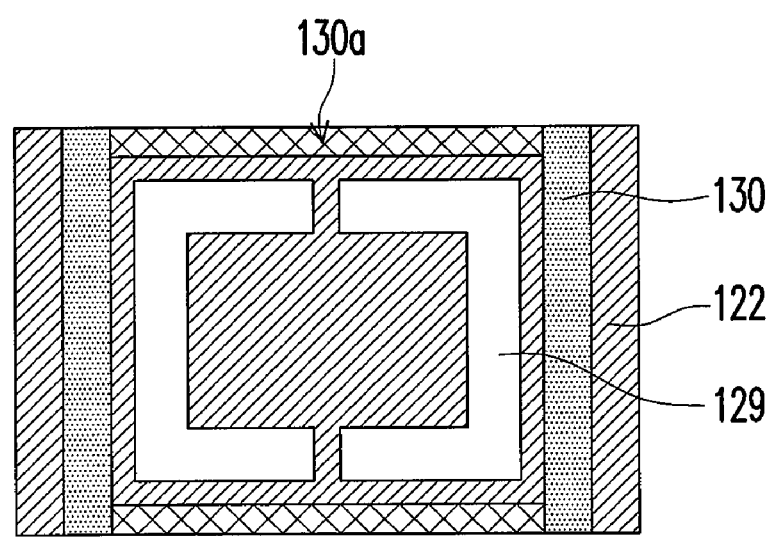
Figure 1G:
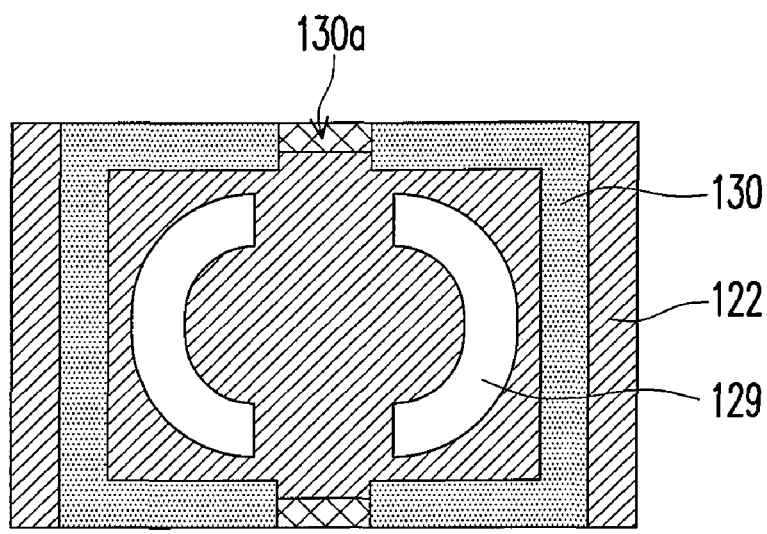
Figure 1H:
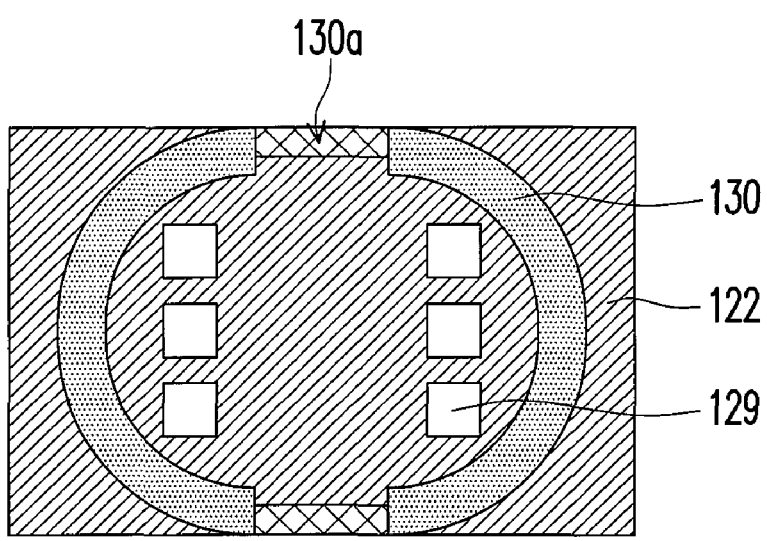
Figure 1I:
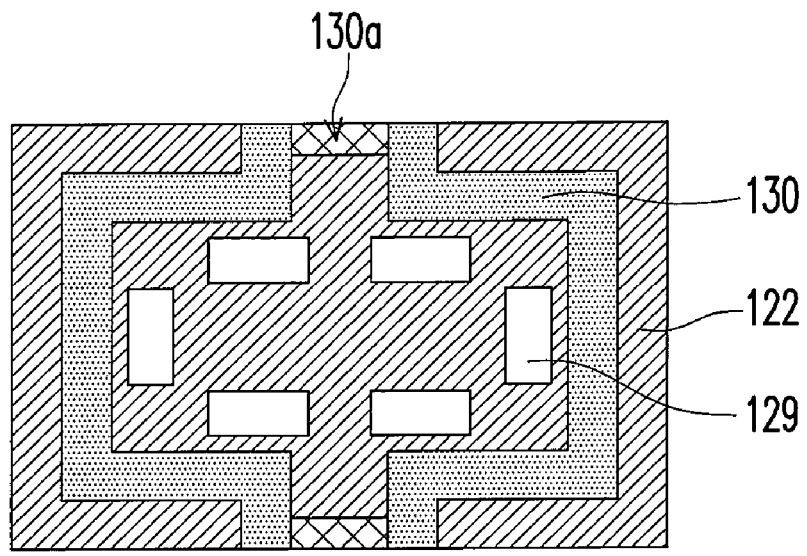

In the second embodiment, as shown in FIGS. 1D and 1D-1, the specimen kit could further include at least one micro-channel optionally. The micro-channels 119 and 129 are respectively disposed in the opposite sides of the observation windows 118 and 128, for example. That is, the micro-channel 119 or 129 encroaches the film 112 or 122 and the support material 114 or 124 thereunder. More specifically, the micro-channels 119 and 129 are surrounded by the sealant 130, so that the micro-channels 119 and 129 are located within the enclosed specimen cell 140. Each of the micro-channels 119 and 129 has a width within the range of 1 μm to 900 μm, preferably 10 μm to 500 μm, a length within the range of 1 μm to 900 μm, preferably 10 μm to 500 μm, and a depth within the range of 1 μm to 500 μm, preferably 10 μm to 250 μm.

Figure 1J:
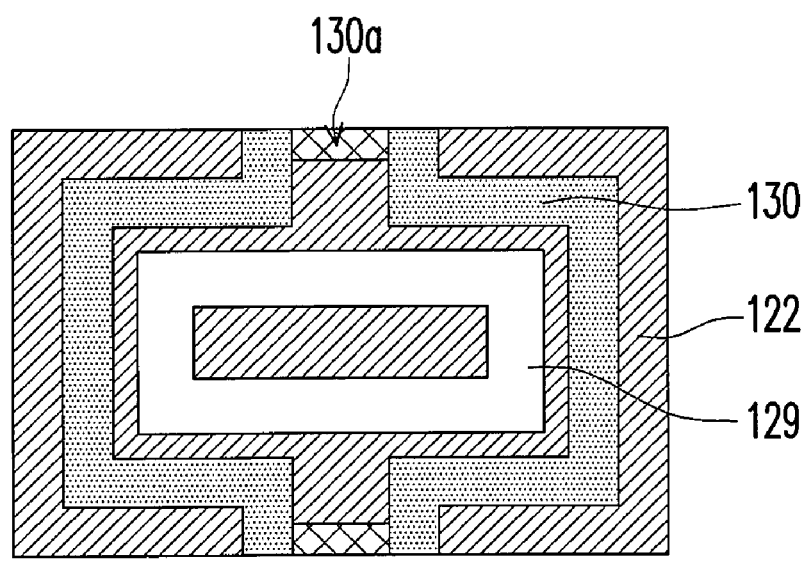
Figure 1K:
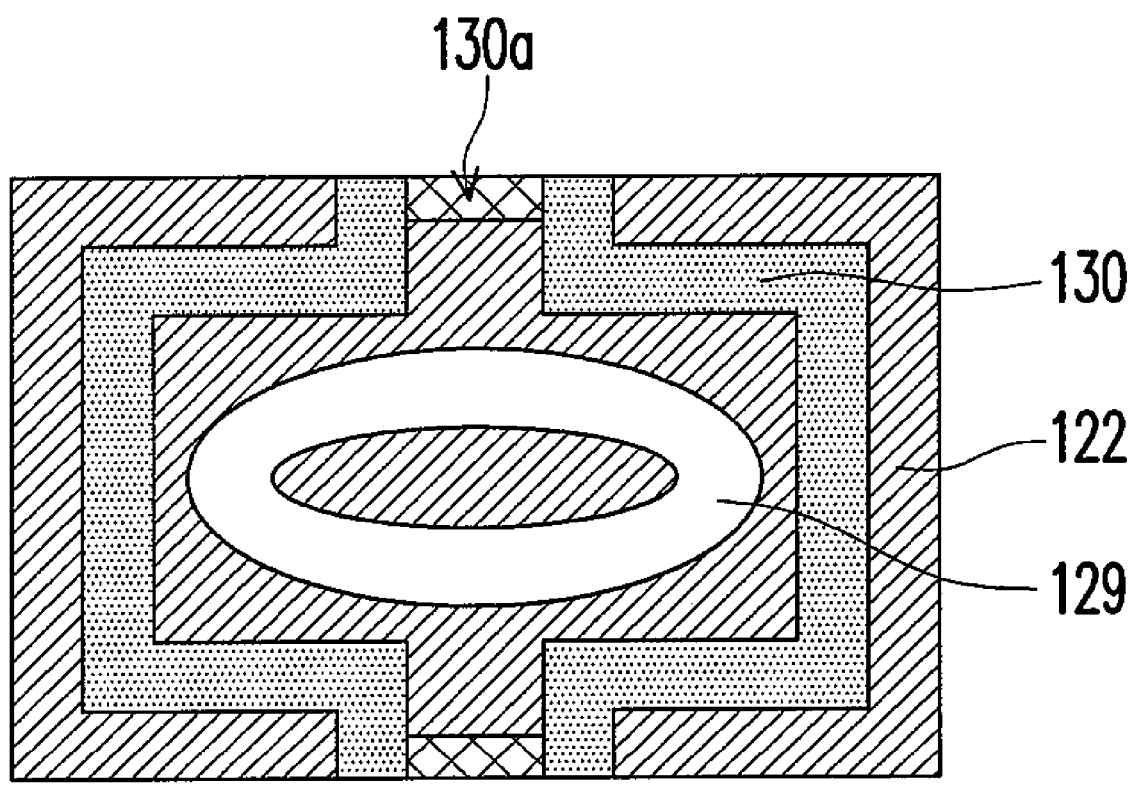

Each of the micro-channels 119 and 129 may include separated bar-like patterns, separated arc patterns, separated half rectangular patterns or any other separated geometric patterns, as shown in FIGS. 1E-1I. In other embodiments, micro-channels 119 and 129 can also have continuous ring patterns, as shown in FIGS. 1J and 1K.

Furthermore, the application pattern of the sealant 130 is not particularly limited in this invention, and can be a rectangular pattern or an annular pattern as shown in FIGS. 1E-1K, or a pattern hybridized from the two patterns, or even an irregular pattern. What's more, the patterns of the sealant 130 and the micro-channels 119 and 129 are not limited to those shown in the embodiments illustrated by FIGS. 1E-1K, alteration of the patterns is allowed in this invention.

Accordingly, the substantially identical substrates 110 and 120 are assembled with spacers 132 separating the substrates 110 and 120 from each other, and the space between the fringes of the two substrates 110 and 120 is hermetically sealed by the sealant 130 to define the specimen cell 140 between the substrates 110 and 120. The films 112 and 122 are set face-to-face and spaced by the interval 131. The substrates 110 and 120 are disposed by means of aligning the observation windows 118 and 128 in line. The films 112 and 122 at the observation windows 118 and 128 are transparent to the electron beam utilized in the electron microscope; that is, an electron beam can travel through the film 112 or 122 to reach a specimen (not shown) accommodated in the specimen cell 140.

The aforementioned micro-channels 119 and 129 are optional elements of the specimen kit claimed in this invention. As for the purpose of the micro-channels 119 and 129, a specimen or one or more associated ingredients, e.g., biological nutrients, can be filled into the specimen cell 140 by a pre-filling process and into the micro-channels 119 and 129, and the micro-channels 119 and 129 can also enlarge the capacity of the specimen cell 140. Therefore, a liquid specimen or a volatile specimen accommodated in the specimen cell 140 enclosed by the substrates 110 and 120 and the sealant 130 can be observed by an electron microscope.

A method for fabricating the foregoing specimen kit according to an example of the second embodiment of this invention is then described. The method is merely one of the methods which enable one of ordinary skill in the art to make the specimen kit claimed in this invention, but does not limit the scope of this invention. In this embodiment, the fabricating method demonstrates the procedures for constructing the specimen kit with micro-channels, as shown in FIG. 1D, in detail. It would be obvious to one of ordinary skill in the art at the time of the invention to fabricate other specimen kits with or without micro-channels in a similar manner.

Figure 2A:
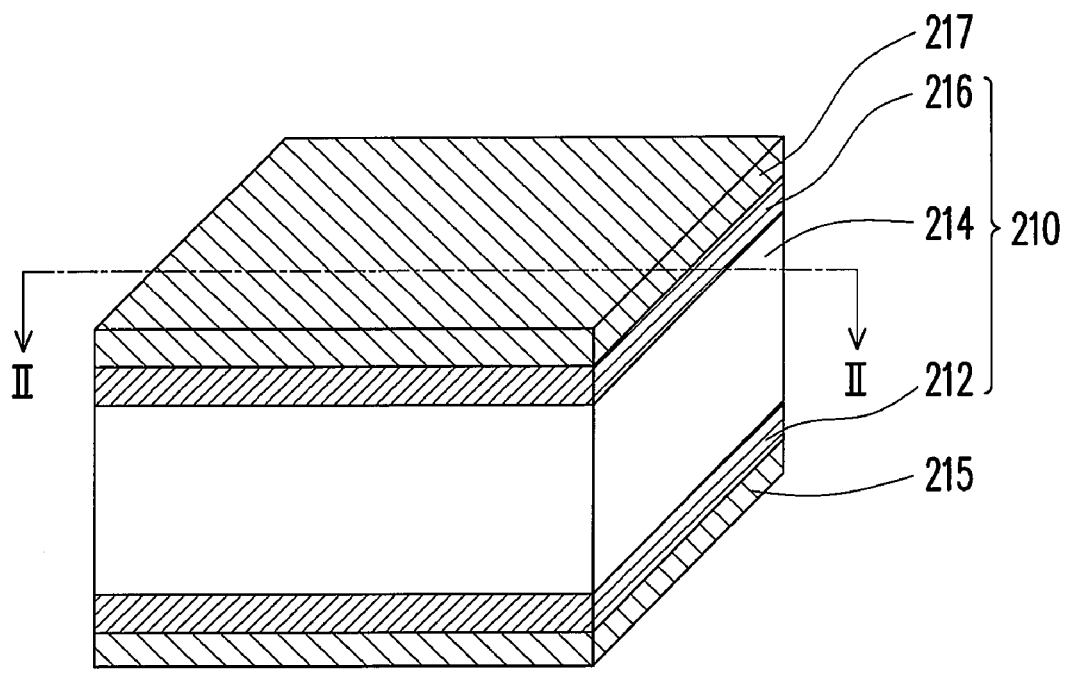
FIGS. 2A, 3A, 4A, 5A, 6A and 7 illustrate, in a schematic perspective view, a process of fabricating a specimen kit with micro-channels according to an example of the second embodiment of this invention.
Figure 2B:
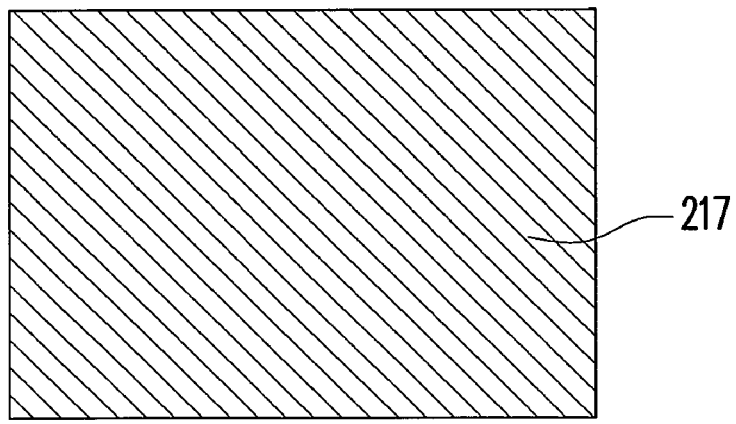
FIGS. 2B, 3B, 4B, 5B, and 6B are schematic top views of the specimen kit with micro-channels respectively in FIGS. 2A, 3A, 4A, 5A and 6A.
Figure 2C:
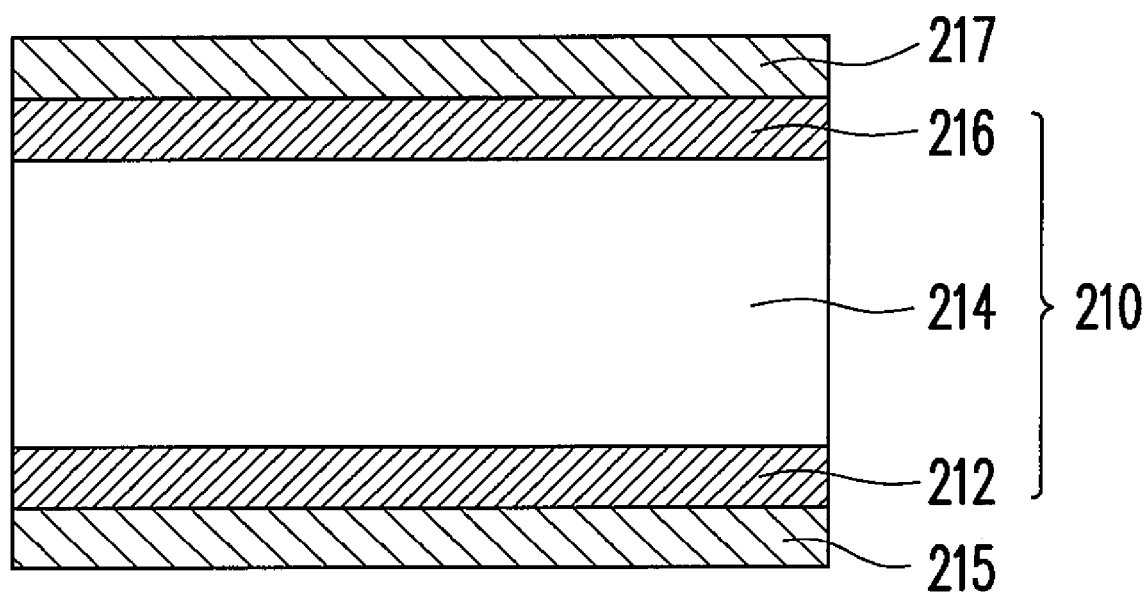
FIGS. 2C, 3C, 4C, 5C, and 6C are schematic cross-sectional views of the specimen kit with micro-channels respectively in FIGS. 2A, 3A, 4A, 5A and 6A along lines II-II, III-III, IV-IV, V-V and VI-VI respectively.

Referring to FIGS. 2A-2C, a substrate 210 is provided, which is composed of, for example, a support material 214 and two films 212 and 216 formed on both sides of the support material 214. Each of the films 212 and 216 has a thickness within the range of 2 nm to 100 nm, preferably 5 nm to 100 nm. The support material 214 can be polishing, or a metal oxide layer such as an aluminium oxide layer. The films 212 and 216 include, e.g. silicon oxide, silicon nitride, silicon carbide or a derivative thereof, wherein the forming method thereof can be chemical vapour deposition (CVD) or thermal oxidation in case of silicon oxide. Then, mask layers 215 and 217 are formed respectively on the films 212 and 216. One may use, for example, silicon nitride as the material of the mask layers 215 and 217, and the forming method thereof can be low pressure chemical vapour deposition (LPCVD).

Figure 3A:
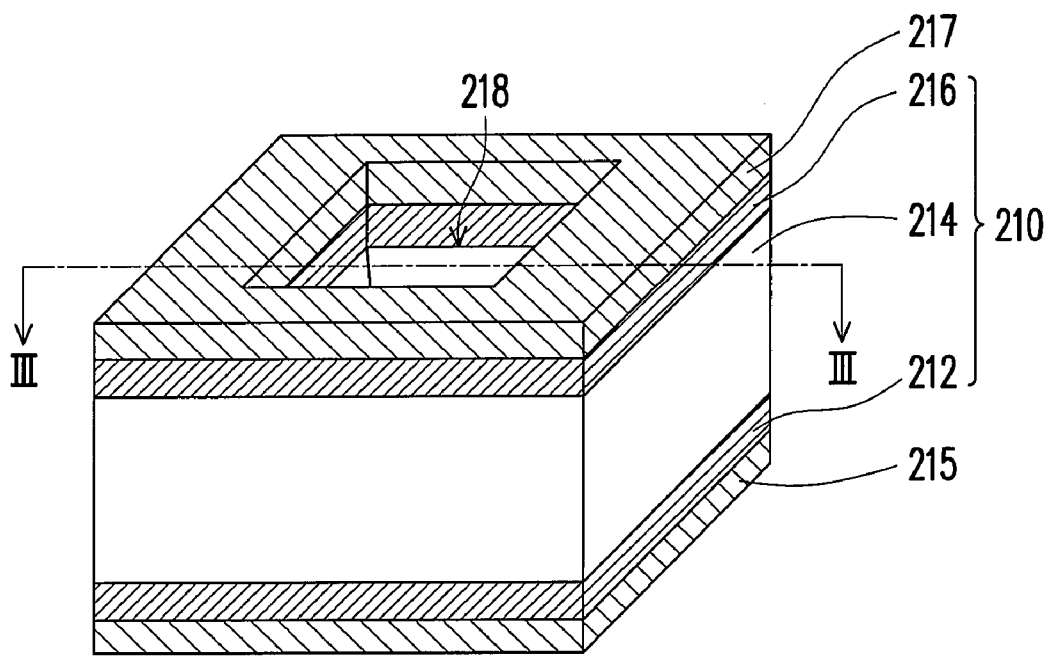
Figure 3B:
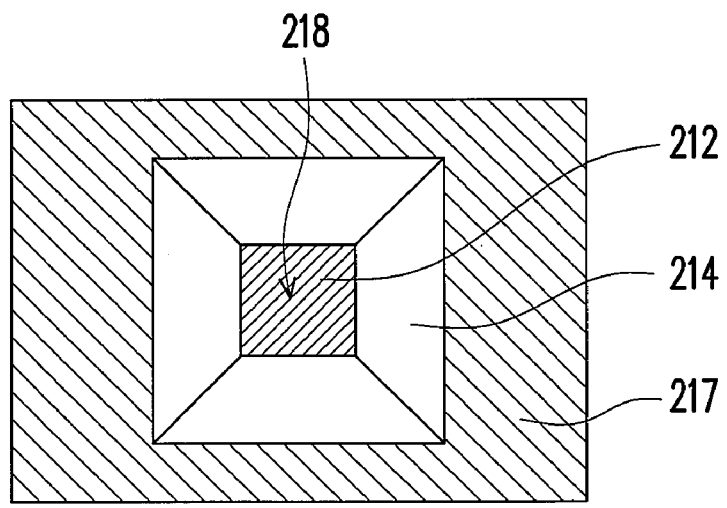
Figure 3C:
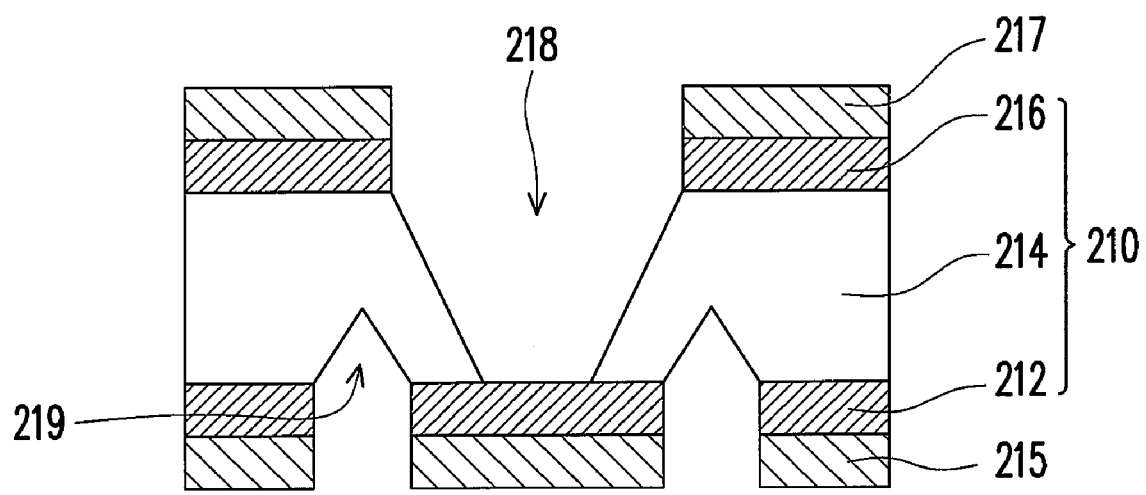

Referring to FIGS. 3A-3C, the mask layers 215 and 217 and the films 212, 216 are patterned by performing two photolithography processes and an etching process to form openings therein exposing portions of both sides of the support material 214. A portion of the support material 214 is removed to form an observation window 218 with the mask layer 217 as a mask and the film 212 as an etching stop layer. The area of the observation window 218 is within the range of 1 μm² to 1 mm², preferably 100 μm² to 1 mm². Simultaneously, another portion of the support material 214 is removed to form micro-channels 219 with the mask layer 215 as a mask. Each of the micro-channels 219 has a width within the range of 1 μm to 900 μm, preferably 10 μm to 500 μm, a length within the range of 1 μm to 900 μm, preferably 10 μm to 500 μm, and a depth within the range of 1 μm to 500 μm, preferably 10 μm to 250 μm. The method for removing the portions of the support material 214 may include anisotropically etching the same by subjecting the support material 214 to a tetraethylammonium hydroxide (TMAH) solution or a potassium hydroxide (KOH) solution, so that the observation window 218 and the micro-channels 219 can be formed in the same procedure. In another embodiment, the observation window 218 and the micro-channels 219 may be formed individually by performing two times of reactive ion etching (RIE) or inductively coupled plasma (ICP) dry etching using $CH_xF_y$ and $H_2$ as reaction gases.

Figure 4A:
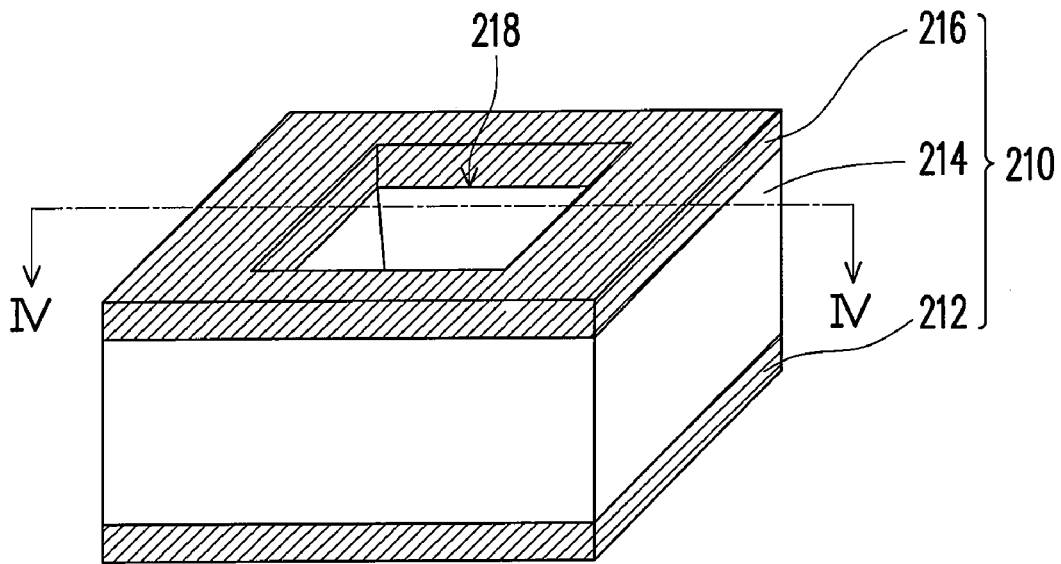
Figure 4B:
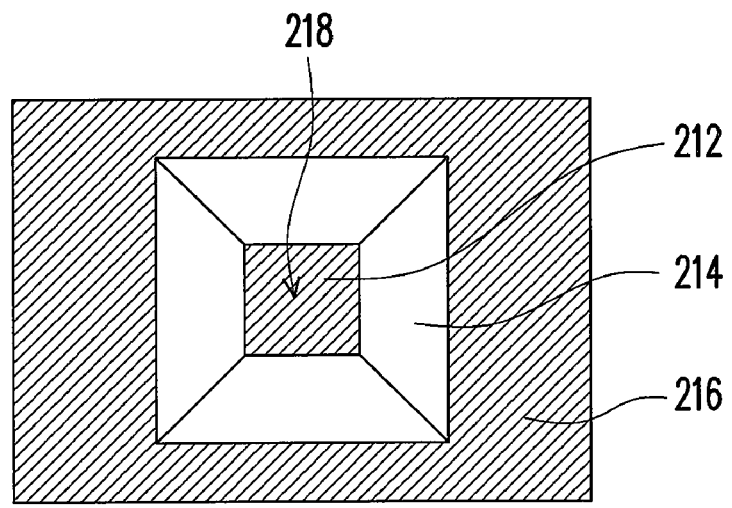
Figure 4C:
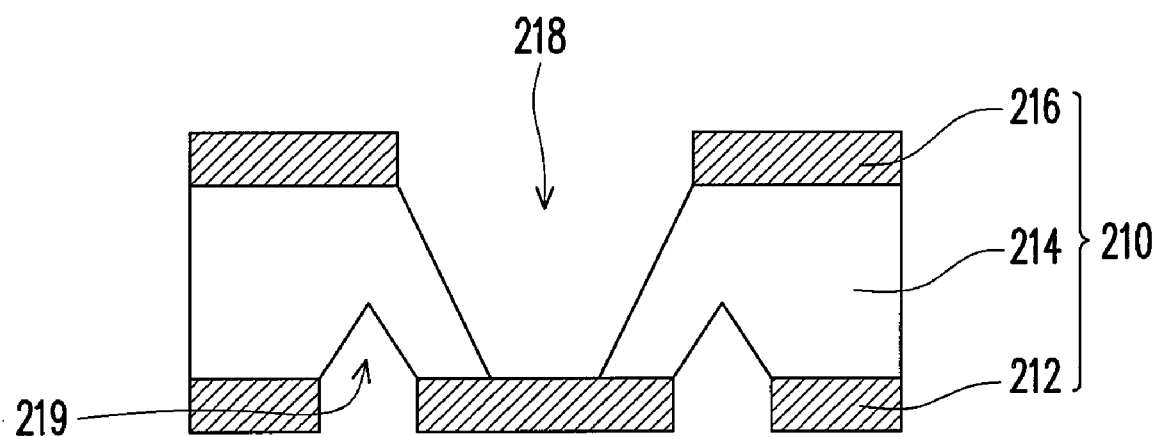

Referring to FIGS. 4A-4C, the mask layers 215 and 217 are then removed. The method for removing the mask layers 215 and 217 includes wet-etching the same by hot phosphoric acid.

Figure 5A:
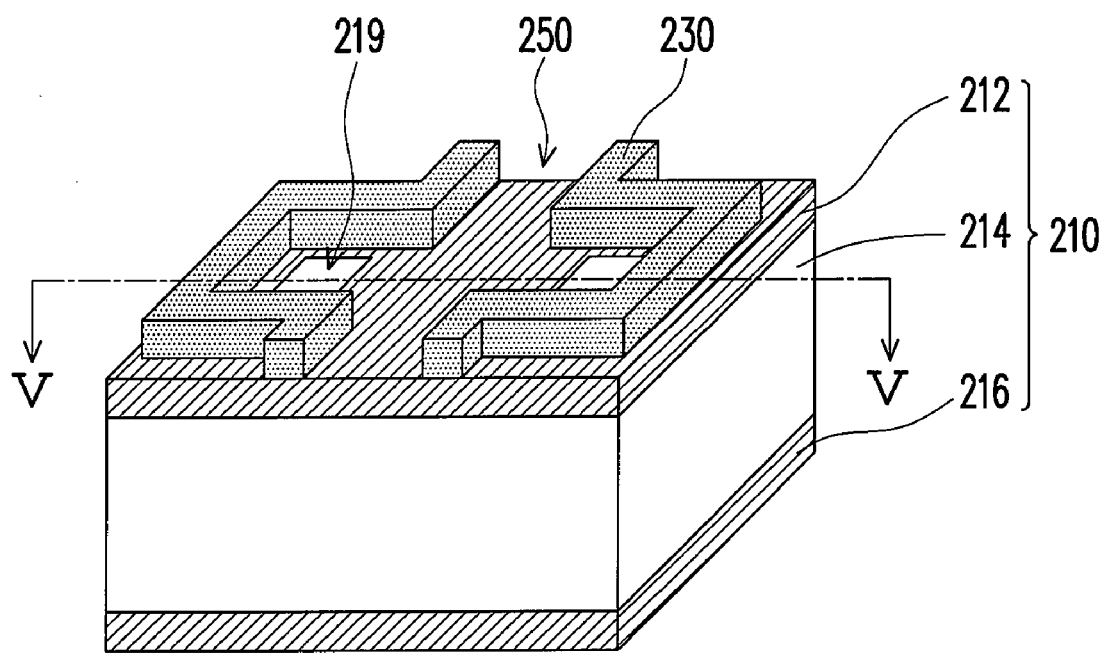
Figure 5B:
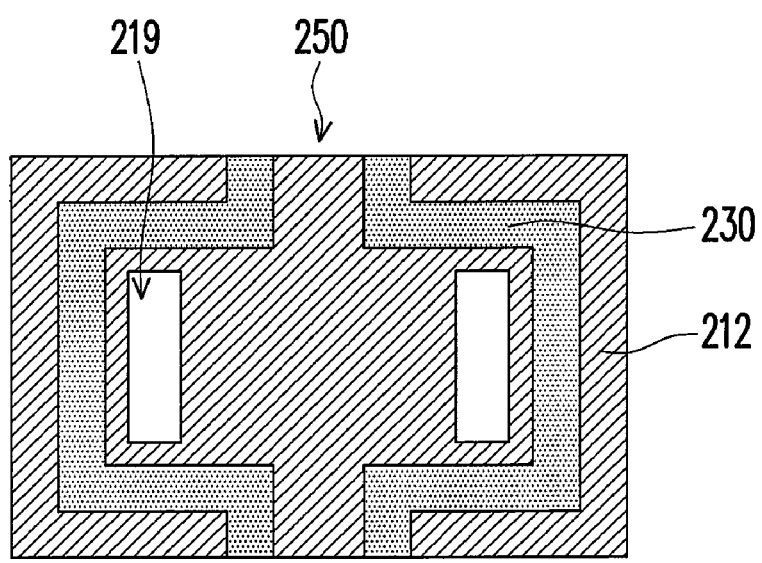
Figure 5C:
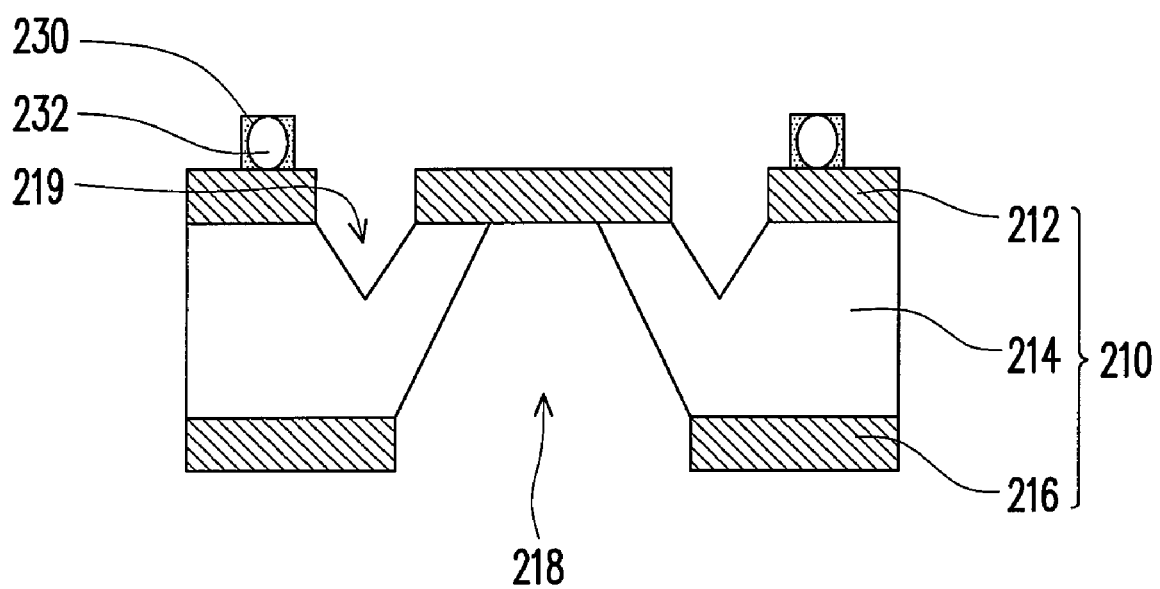

Referring to FIGS. 5A-5C, an adhesive 230 is applied to the surface of the film 212 through which the micro-channels 219 are formed. The adhesive 230 may be an ultraviolet (UV) curable adhesive, silicone, thermosetting resin like epoxy resin, or other adhesive material binding excellently to the film 212. The adhesive 230 is applied by means of a sealant dispenser or screen print. It is noted that in an embodiment, the application of the adhesive 230 does not form a totally enclosed region, and two slots 250 remain at two opposite edges of the film 212, as shown in FIGS. 5A and 5B. The slots 250 are retained for the filling of a specimen in subsequent steps.

Additionally, in an embodiment as shown in FIG. 5C, the adhesive 230 as a sealant is mixed with spacers 232 before applied to the surface of the film 212. The material of the spacers 232 can be silicon ball, glass fiber, photoresist, metal, silicon oxide, silicon nitride, silicon carbide or a derivative thereof, and the size of the spacers 232 is, for example, within a range of 10 nm to 20 μm, preferably 0.1 μm to 10 μm. If photoresist is used as the material of the spacers 232, the spacers 232 can be formed with a photolithography process. If metal, silicon oxide, silicon nitride, silicon carbide or a derivative thereof is used, the spacers 232 can be formed with a photolithography process and an etching process.

In another embodiment, the spacers 232 and the adhesive 230 are applied to the surface of the film 222 individually. Specifically, the spacers 232 may be applied to the surface of the film 222 before or after the adhesive 230 is applied. In such a case, the spacers 232 can have a random distribution on the film 222 or can be positioned by means of a mask.

Figure 6A:
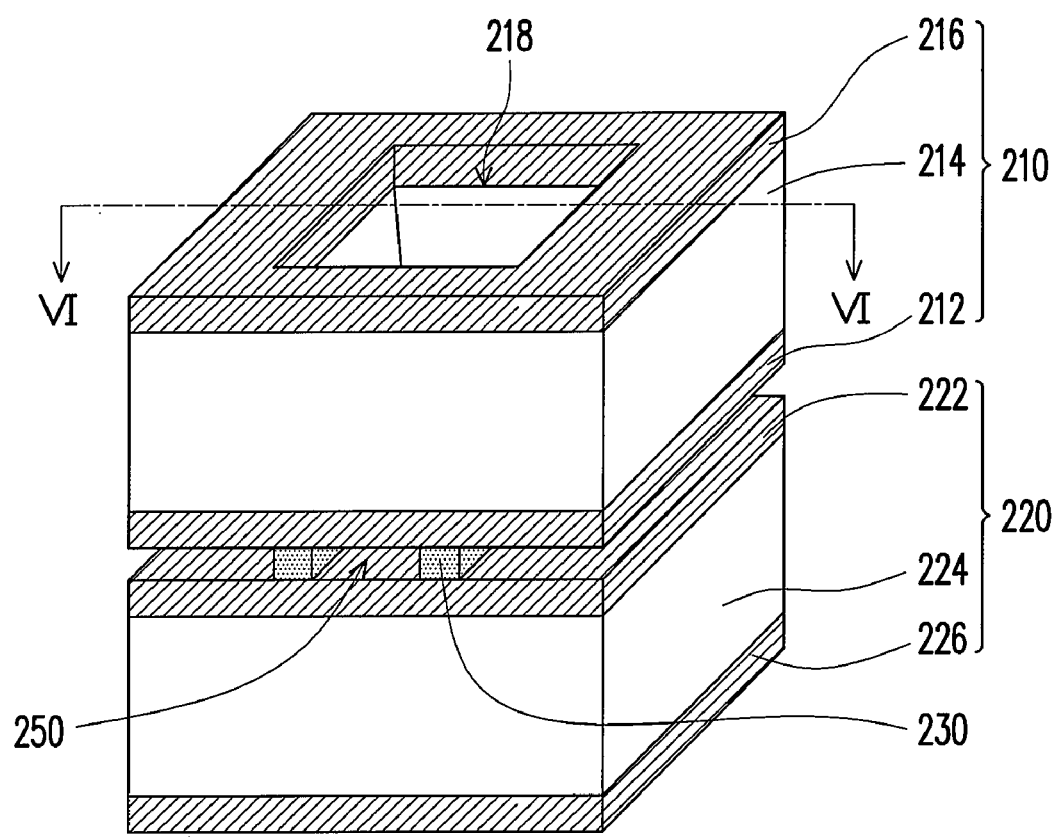
Figure 6B:
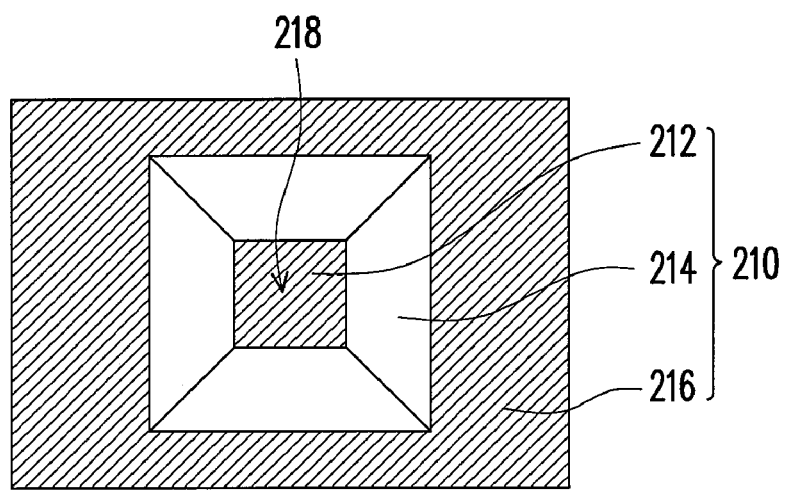
Figure 6C:
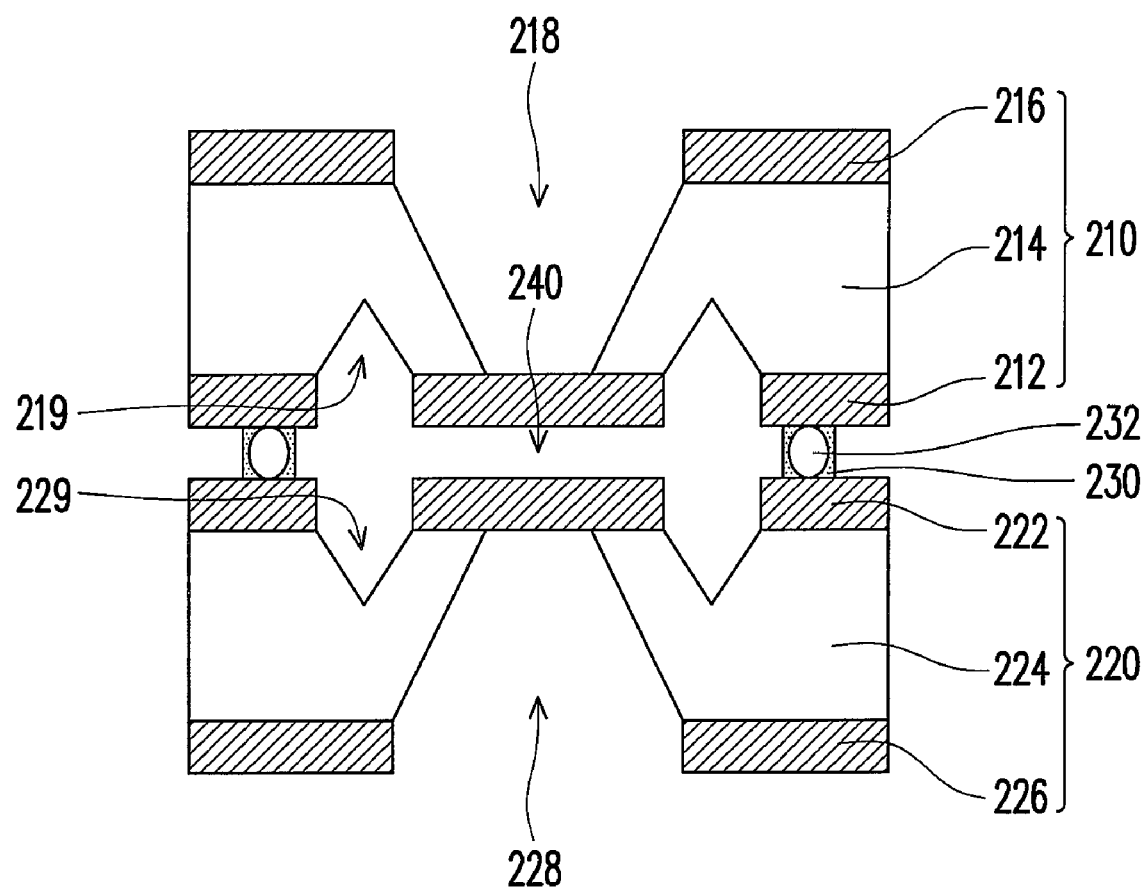

Referring to FIGS. 6A-6C, two substantially identical substrates 210 and 220 having been processed as above are provided, wherein the substrate 220 includes all the same elements of the substrate 210 with the same disposing manner. The two substrates 210 and 220 are then disposed with their films 212 and 222 through which the respective micro-channels 219 and 229 are formed in a face-to-face arrangement. The observation windows 218 and 228 of the two substrates 210 and 222 are aligned with each other, possibly by using a precise translation stage with the aid of an optical system. The two substrates 210 and 220 are then assembled with each other by curing the adhesive 230, while the spacers 232 applied to the surface of the films 212 and 222 define the interval between them. If silicone or thermosetting resin, like epoxy resin, is used as the adhesive 230, the assembling method may be hot pressing. In another embodiment, if a UV-curable adhesive is used as the adhesive 230, a UV exposure is required.

The space between the two substrates 210 and 220 that is enclosed by the adhesive 230 constitutes a specimen cell 240 for accommodating a specimen. The micro-channels 219 and 229 and the specimen cell 240 are contiguous spatially. The specimen cell 240 is then filled with a specimen through the slots 250, possibly by the capillary effect in case the specimen is in a liquid form.

Figure 7:
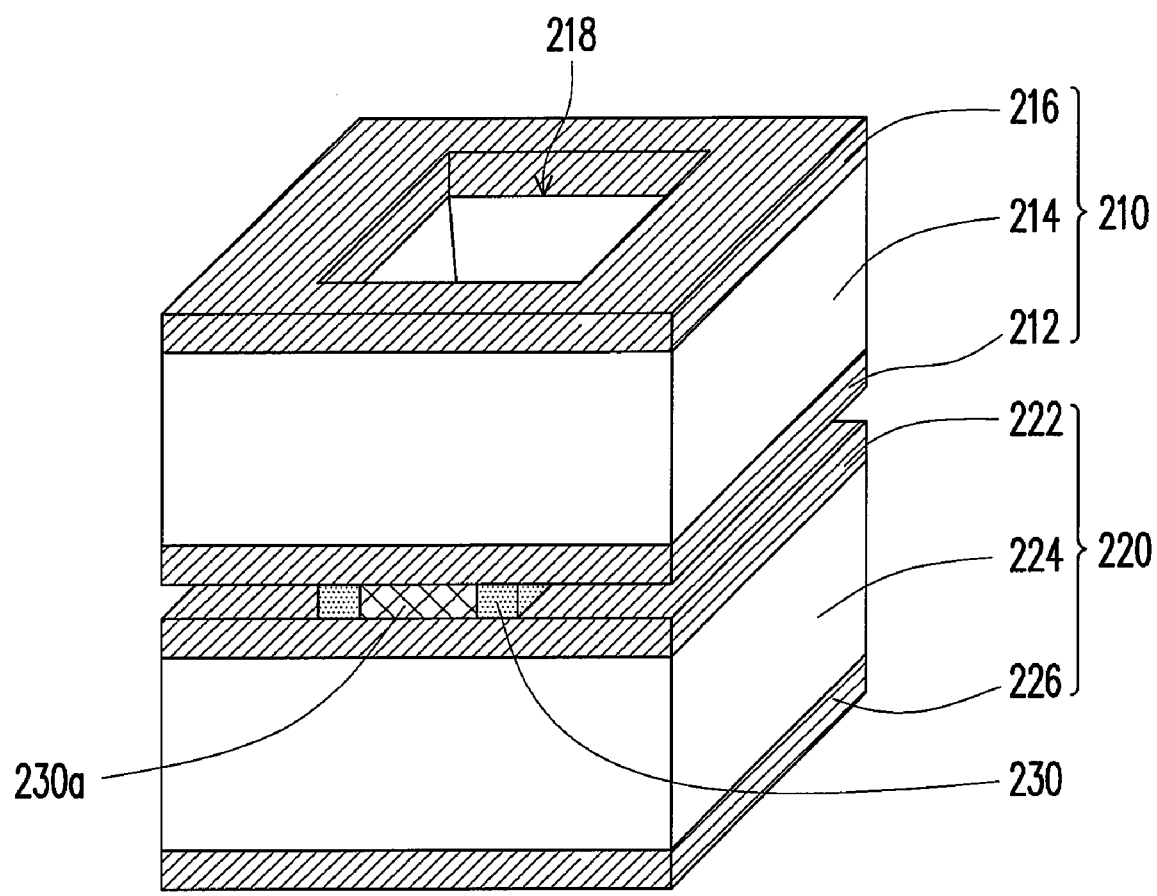
Figure 8:
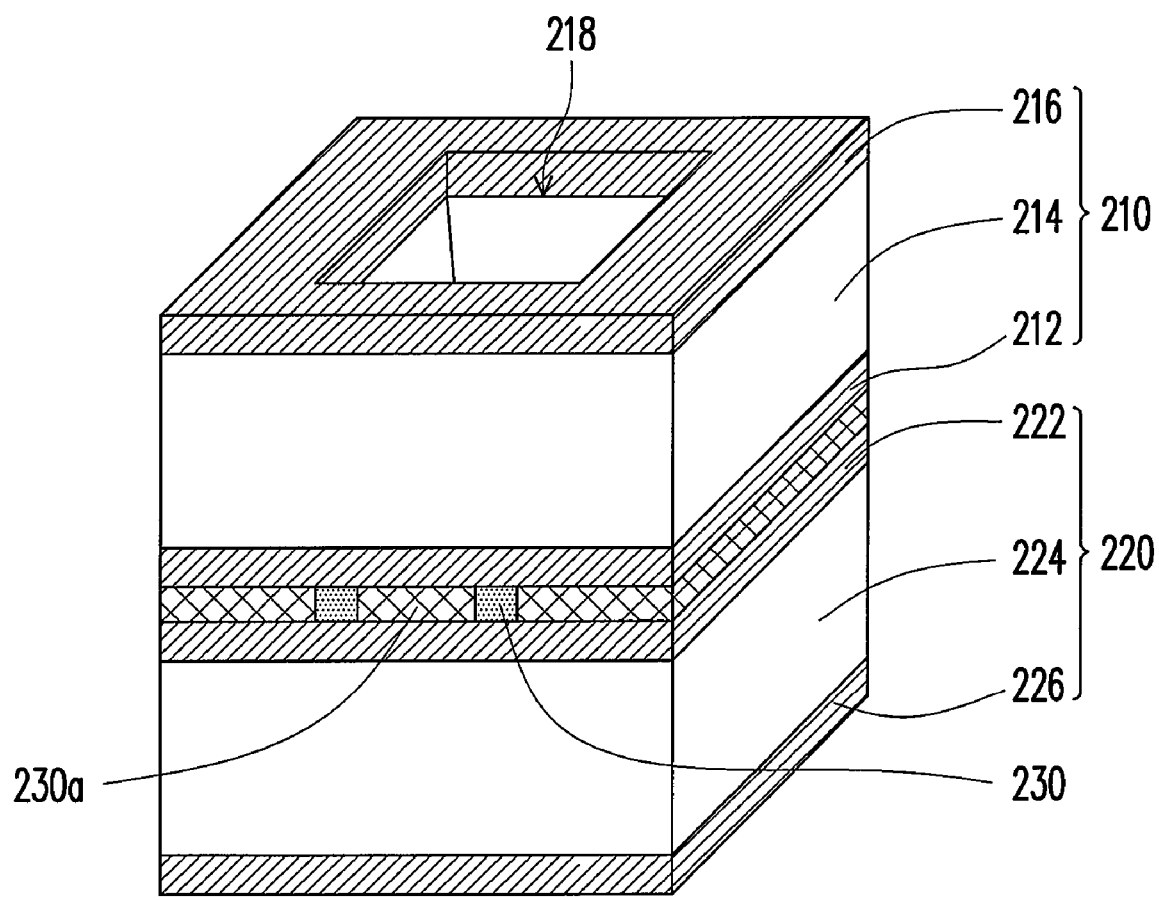
FIG. 8 is schematic perspective view of a specimen kit according to another embodiment of this invention.

Referring to FIG. 7, the slots 250 are then sealed by a sealant 230a. The sealant 230a may include the same material of the adhesive 230, e.g., a UV-curable adhesive, silicone, thermosetting resin like epoxy resin, or other adhesive material binding excellently to the films 212 and 222. The adhesive 230 and the sealant 230a hermetically seal the space between the fringes of the films 212 and 222 to make the specimen cell 240 an enclosed space isolated from the outer. In another embodiment, as shown in FIG. 8, in addition to sealing the slots 250 as the filling inlet of the specimen, the sealant 230a may be further applied to the inter-substrate space outside of the specimen cell 240 to seal the specimen cell 240 more completely.

Figure 9A:
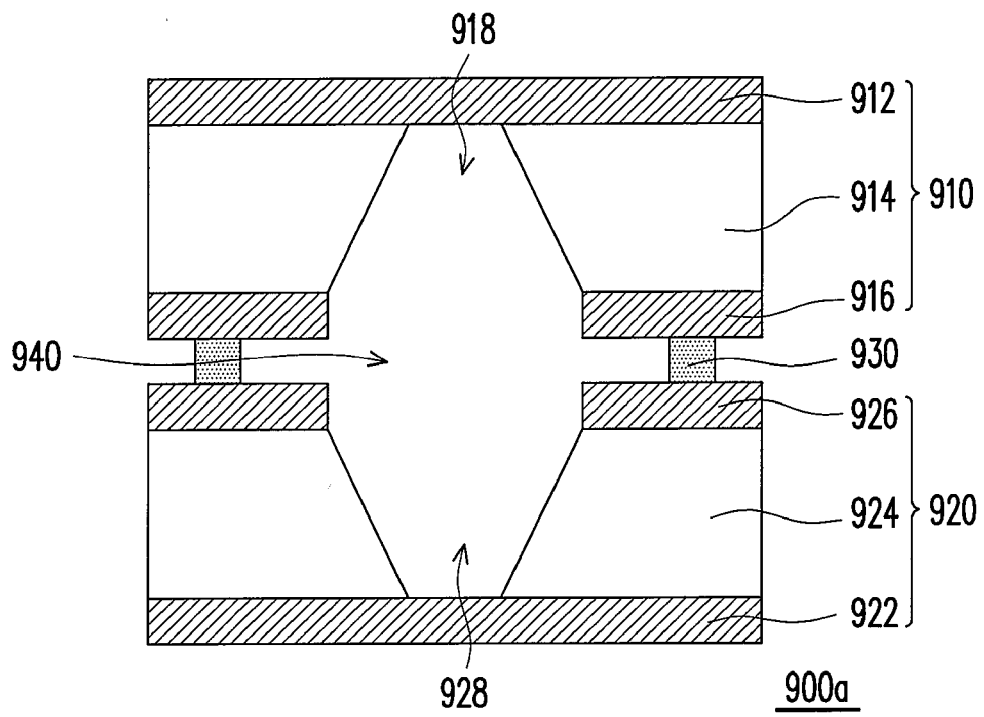
FIGS. 9A and 9B are schematic cross-sectional views of the specimen kits without micro-channels respectively according to other embodiments of this invention that are different in the manner of jointing the two substrates.
Figure 9B:
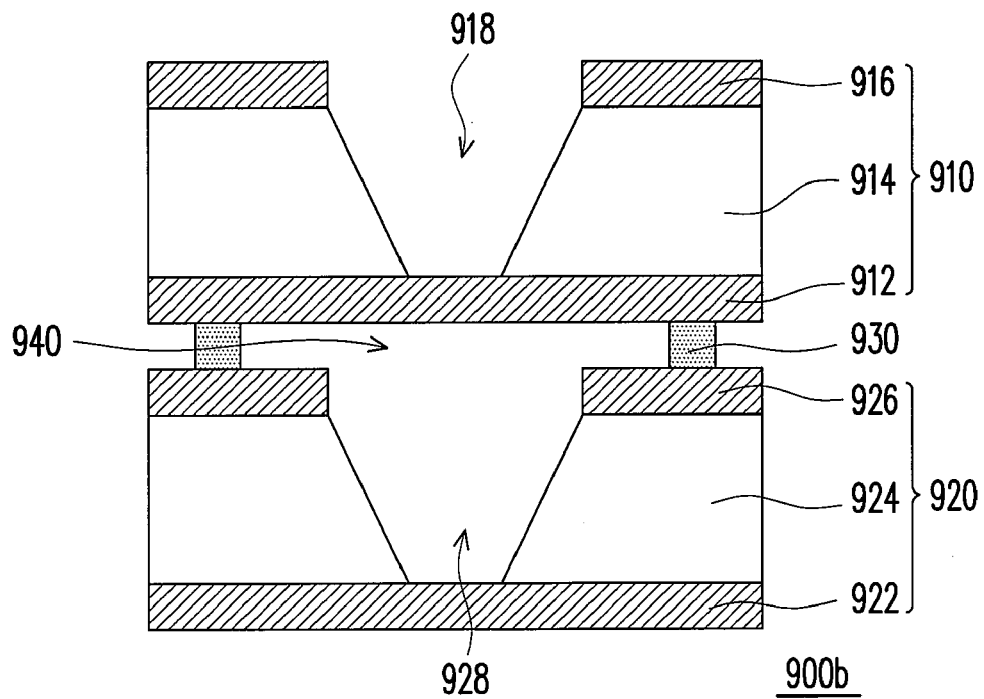

Moreover, the specimen kits 900a and 900b without micro-channels according to two other embodiments are shown in FIGS. 9A and 9B. Each of the specimen kits 900a and 900b includes two substrates 910 and 920 and a sealant 930. The substrate 910 includes a support material 914 with two films 912 and 916 formed on both sides thereof. The substrate 920 includes a support material 924 with two films 922 and 926 formed on both sides thereof. Also, each of the substrates 910 and 920 has an observation window 918 or 928 formed therein. The observation window 918 or 928 is presented in a form of an opening formed in the support material 914 or 924 and in the film 916 or 926 to expose a portion of the film 912 or 922. The sealant 930 is applied between the substrates 910 and 920 to hermetically seal the space between the fringes thereof, so as to enclose a specimen cell 940. Additionally, spacers (not shown) might be disposed between the substrates 910 and 920 to assist defining the interval between them, wherein spacers can be mixed with the sealant 930 or applied to a region other than where the sealant 930 is disposed.

The elements of the specimen kits 900a and 900b are roughly identical to those of the specimen kit shown in FIG. 1C, while the difference is in orientations that the two substrates 910 and 920 are jointed. More specifically, the specimen kit, as shown in FIG. 1C, has the observation windows 118 and 128 which are presented in a form of the openings, wherein the openings face toward the outside of the specimen kit respectively. In other embodiments, the specimen kit 900a, as shown in FIG. 9A, has the openings of the observation windows 918 and 928 faced toward the inside of the specimen kit 900a respectively, that is, within the specimen cell 940. In other words, the films 916 and 926 are disposed face-to-face and the sealant 930 is applied between the films 916 and 926.

The specimen kit 900b, as shown in FIG. 9B, has the opening of the observation window 918 faced toward the outside of the specimen kit 900b and the opening of the observation window 928 faced toward the inside of the specimen kit 900b. With respect to the specimen kit 900b, the films 912 and 926 are disposed face-to-face and the sealant 930 is applied between them.

Figure 9C:
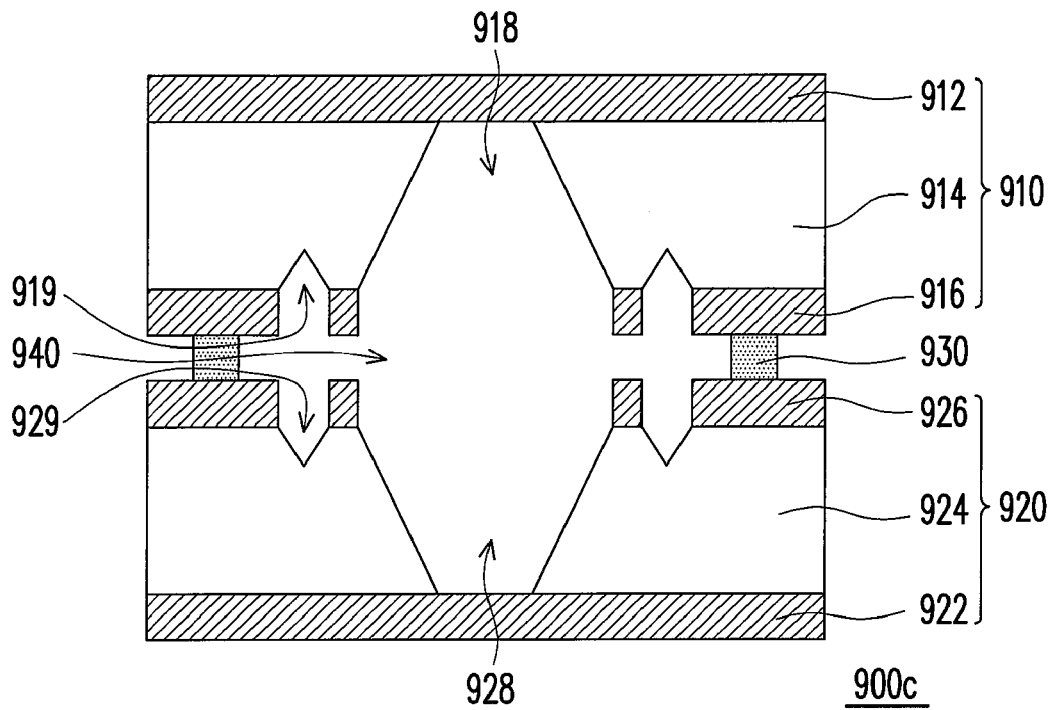
FIGS. 9C and 9D are schematic cross-sectional views of the specimen kits with micro-channels respectively according to still other embodiments of this invention that are different in the manner of jointing the two substrates.

It should be noted that in still other embodiments, the specimen kits 900c and 900d with micro-channels 919 and 929 formed therein may have the substrates 910 and 920 jointed like the orientations described above, as shown in FIGS. 9C and 9D. Referring to FIG. 9C, the sealant 930 is applied between the films 916 and 926, while the openings of the observation windows 918 and 928 faced toward the inside of the specimen kit 900c respectively. In this embodiment, the micro-channel 919 or 929 encroaches the film 916 or 926 and the support material 914 or 924 thereunder, so that the micro-channels 919 and 929 could be located within the specimen cell 940.

Figure 9D:
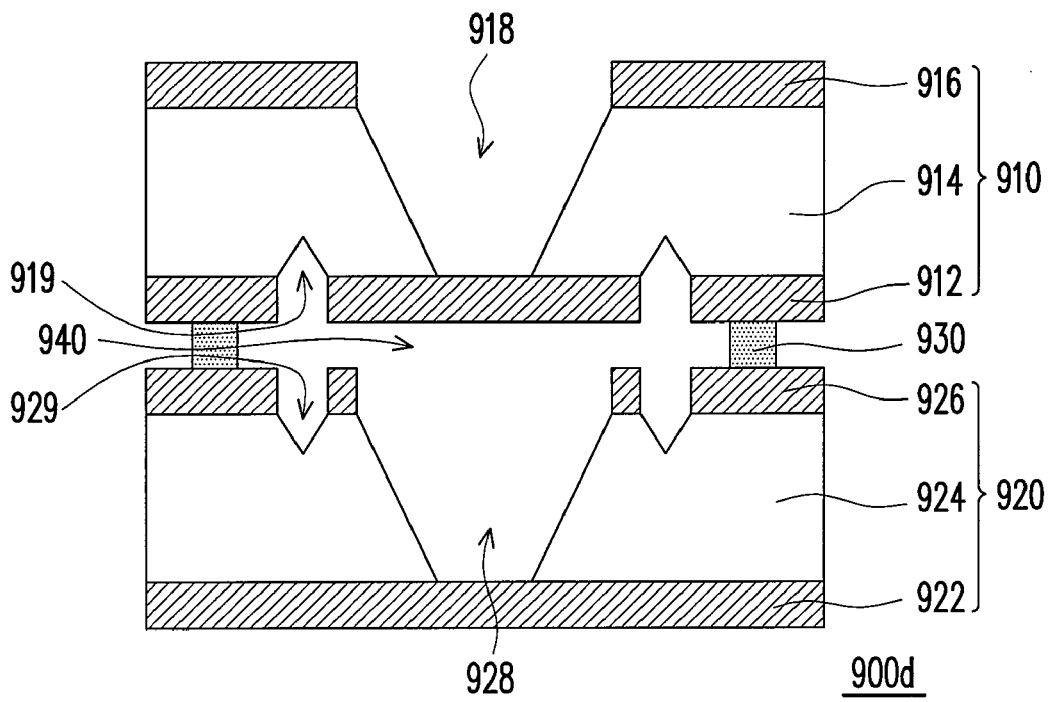

With regard to the specimen kit 900d, as shown in FIG. 9D, the opening of the observation window 918 faced toward the outside of the specimen kit 900d, and the opening of the observation window 928 faced toward the inside of the specimen kit 900d. The micro-channel 919 or 929 encroaches the film 912 or 926 and the support material 914 or 924 thereunder, respectively. Accordingly, the films 912 and 926 are disposed face-to-face and the sealant 930 is applied between them, so that the micro-channels 919 and 929 could be located within the specimen cell 940.

The specimen kit claimed in the present invention is not limited to those shown in the embodiments illustrated above. That is to say, the specimen kit of this invention can have micro-channels formed therein or not, and the manner of the two substrates jointed can also be altered. Modifications can be made to the formation of micro-channels and to the orientation of two substrates jointed in this invention.

In view of the above, the specimen kit of this invention is suitable for various types of specimens, especially liquid specimens, magnetic specimens or volatile specimens, and can isolate a specimen from the vacuated environment of the electron microscopes. Further, the specimen kit of this invention can be applied to all kinds of electron microscopes, so that modification of the retainer, specimen holder or other elements of an electron microscope is no longer required.

Based on the above descriptions of this invention, the fabricating method of the claimed specimen kit can be put into practice easily as a semiconductor process and also be produced in a large scale, so that production cost can be reduced.

Moreover, the present invention solves the problems of the prior-art specimen kits for electron microscopes by strategically structuring a specimen cell made up by a tough inorganic material which is electron beam-penetrable and can isolate a liquid specimen, a magnetic specimen or a volatile specimen from an evacuated environment.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A specimen kit for enclosing a specimen to be observed by a microscope, comprising:
   a first substrate that has therein a first observation window at which a thickness of the first substrate is smaller than a thickness of the other parts of the first substrate;
   a second substrate that has therein a second observation window at which a thickness of the second substrate is smaller than a thickness of the other parts of the second substrate, being disposed on the first substrate such that the second observation window is aligned to the first observation window and an interval is present between the first and the second substrates, wherein a material of the first observation window and the second observation window is silicon oxide; and
   a sealant, disposed between the first and the second substrates and surrounding the first and the second observation windows to seal a space between fringes of the first and the second substrate, wherein the sealant defines a specimen cell and at least one slot for filling the specimen cell with the specimen between the first and the second substrates, and each of the first substrate and the second substrate comprises no opening penetrating through each of the first substrate and the second substrate within the specimen cell.

2. The specimen kit according to claim 1, wherein the microscope is an electron microscope, and the first and the second substrates respectively at the first and the second observation windows can be penetrated by an electron beam utilized in the electron microscope.

3. The specimen kit according to claim 1, further comprising at least one micro-channel on a surface of at least one of the first and the second substrates within the specimen cell.

4. The specimen kit according to claim 3, wherein the micro-channel has a width within a range of 1 μm to 900 μm, a length within a range of 1 μm to 900 μm, and a depth within a range of 1 μm to 500 μm.

5. The specimen kit according to claim 1, wherein areas of the first and the second observation windows are within a range of 1 μm$^2$ to 1 mm$^2$.

6. The specimen kit according to claim 1, wherein the first and the second substrates have thicknesses within a range of 2 nm to 100 nm, respectively at the first and the second observation windows.

7. The specimen kit according to claim 1, wherein the interval between the first and the second substrates is within a range of 10 nm to 20 μm.

8. The specimen kit according to claim 1, further comprising spacers disposed between the first and the second substrates.

9. The specimen kit according to claim 8, wherein the spacers are mixed with the sealant or disposed independently.

10. The specimen kit according to claim 1, wherein at least one of the first and the second substrates comprises a support material and a film on a side of the support material.

11. The specimen kit according to claim 10, wherein the observation window of the at least one of the first and the second substrates comprises only a portion of the film.

12. The specimen kit according to claim 10, wherein the support material comprises semiconductor or metal oxide.

13. A method for fabricating a specimen kit for enclosing a specimen to be observed by a microscope, comprising:
   providing two substrates;
   forming an observation window in each substrate, wherein a thickness of the substrate at the observation window is smaller than a thickness of the other parts of the substrate, and a material of the observation windows is silicon oxide; and
   assembling the two substrates with a sealant such that an interval is present between the two substrates and the observation windows of the two substrates are aligned with each other to define a specimen cell and at least one slot formed between the two substrates for filling the specimen cell with the specimen, wherein each of the two substrates comprises no opening penetrating through each of the two substrates within the specimen cell.

14. The method according to claim 13, wherein the microscope is an electron microscope, and the two substrates at the observation windows can be penetrated by an electron beam utilized in the electron microscope.

15. The method according to claim 13, further comprising forming at least one micro-channel on a surface of at least one of the two substrates before the two substrates are assembled, wherein the micro-channel is located within the specimen cell after the specimen cell is defined.

16. The method according to claim 15, wherein the micro-channel has a range of width from 1 μm to 900 μm, a length within a range of 1 μm to 900 μm, and a depth within a range of 1 μm to 500 μm.

17. The method according to claim 13, wherein assembling the two substrates comprises:
   applying the sealant to a surface of one of the two substrates;
   aligning the observation windows of the two substrates with each other; and
   binding the two substrates together with the sealant between the two substrates.

18. The method according to claim 17, further comprising applying spacers between the two substrates to assist defining the interval.

19. The method according to claim 18, wherein the spacers are mixed with the sealant, or are applied before or after the sealant is applied.

20. The method according to claim 13, wherein each of the two substrates is formed by steps comprising:
   providing a support material; and
   depositing a film on a surface of the support material.

21. The method according to claim 20, wherein forming the observation window in each substrate comprises:
   depositing a mask layer on a side of the substrate opposite to the film;
   patterning the mask layer to form therein an opening corresponding to the observation window to be formed;
   removing a portion of the support material with the mask layer as a mask to expose a part of the film; and
   removing the mask layer.

22. The method according to claim 20, wherein the support material comprises semiconductor or metal oxide.

23. The method according to claim 13, wherein areas of the observation windows are within a range of 1 μm$^2$ to 1 mm$^2$.

24. The method according to claim 13, wherein each of the two substrates has a thickness within a range of 2 nm to 100 nm at the observation window thereof.

25. The method according to claim 13, wherein the interval between the two substrates is within a range of 10 nm to 20 μm.

* * * * *